United States Patent [19]
Hsu

[11] Patent Number: 5,248,902
[45] Date of Patent: Sep. 28, 1993

[54] SURFACE MOUNTING DIODE

[75] Inventor: C. L. Hsu, Taipei, Taiwan

[73] Assignee: General Instrument Corporation, Hatboro, Pa.

[21] Appl. No.: 752,749

[22] Filed: Aug. 30, 1991

[51] Int. Cl.⁵ ...................... H01L 23/28; H01L 23/30
[52] U.S. Cl. ..................... 257/688; 257/689; 257/690; 257/692; 257/694; 257/719
[58] Field of Search ............... 357/74, 79; 257/688, 257/689, 690, 692, 694, 719

[56] References Cited

U.S. PATENT DOCUMENTS

| | | | |
|---|---|---|---|
| 3,890,637 | 6/1975 | Yamamoto | 357/76 |
| 4,042,951 | 8/1977 | Robinson et al. | 757/74 |
| 4,059,837 | 11/1977 | Suzuki et al. | 357/74 |
| 4,829,364 | 5/1989 | Ohdate | 357/76 |
| 4,835,495 | 5/1989 | Simonutti | 357/81 |
| 5,005,069 | 4/1991 | Wasmer et al. | 357/74 |

FOREIGN PATENT DOCUMENTS 54-140470 10/1979 Japan.
59-43558 3/1984 Japan.

Primary Examiner—Eugene R. LaRoche
Assistant Examiner—Viet Q. Nguyen
Attorney, Agent, or Firm—Allan Jacobson

[57] ABSTRACT

A surface mounted diode comprises a pair of slugs pointed toward each other with a die disposed therebetween, at least one of the slugs being truncated cone shape, and a pair of solder wafers being disposed between the die and each slug to form an electrical connection therebetween. Each slug has a terminal formed at the tail thereof. The largest diameter of the truncated cone shape slug is approximately the same as or greater than the diagonal of the die. The function of the truncated shape of the slug is to protect the die from damage during handling and during curing of the encapsulating resin which occurs during the manufacturing process of the surface mounted diode.

6 Claims, 3 Drawing Sheets

| TABLE I | | | |
|---|---|---|---|
| STRUCTURE | CONVENTIONAL DIODE (FIGS. 1 AND 2) | CONVENTIONAL DIODE (FIGS. 1 AND 2) | THE INVENTION (FIGS. 3 AND 4) |
| PROCESS | ORIGINAL PROCESSES (3) AND (4): (POURING AND SHAKING THE DIODES IN SUB-ASSEMBLY IN THE TOOLING TRAY) | IMPROVED PROCESSES (3') AND (4'): (PICK UP THE DIODES IN SUB-ASSEMBLY ONE BY ONE BY A TWEEZER AND PUT THEM IN THE TOOLING TRAY—TIME CONSUMING AND REQUIRING MANY LABOR HOURS) | ORIGINAL PROCESSES (3) AND (4): (POURING AND SHAKING THE DIODES IN SUB-ASSEMBLY IN THE TOOLING TRA TRAY—CAPABLE OF SAVING LABOR AND TIME WITHOUT DAMAGING THE DICE) |
| SUCCESS RATE | 78% | 94% | 95% |
| FAILURE RATE IN SOLDERING | 2% | 0% | 0% |
| REMARKS: | IN THE EXPERIMENT, NO SAMPLES OF THE DIODE IN TAIWANESE PATENT APPLICATION 76201274 ARE USED. HOWEVER, ACCORDING TO THE CONFIGURATION, IT CAN BE INFERRED THAT THE TEST DATA ARE ALSO APPLICABLE TO THE TAIWANESE PATENT APPLICATION 76201274. | | |

Fig. 5

SURFACE MOUNTING DIODE

FIELD OF THE INVENTION

The present invention relates to a surface mounted diode having at least a truncated shaped slug.

BACKGROUND OF THE INVENTION

In conventional diodes, including that disclosed in Taiwanese Patent Application No. 76201274 entitled "Improved Diode Structure", the slugs are smaller than the die at the place near the contact area between the die and the slugs. The die thus extends beyond the slugs, at least near the contact area between the die and the slugs. Since the die is thus unprotected during the manufacturing process, such as assembling and curing, the die is easily damaged. The damage lowers the yield and reliability of the diodes.

SUMMARY OF THE PRESENT INVENTION

The object of the present invention is to provide a surface mounted diode comprising at least a truncated shaped slug, the largest diameter of the slug being substantially equal to or greater than the diagonal of the die, to reduce the stress exerted on the die by the resin during curing and to protect the die from collision during assembly, thereby providing diodes of high yield and high reliability. Although the embodiment shown is a truncated cone shaped slug, it is understood that various truncated shaped slugs, such as a truncated pyramid, a truncated sphere, or a truncated ellipsoid may be used in conjunction with the present invention. The requirement for the shape of the slug is that it have generally increasing cross sectional area with distance from the die. The truncated surface of the shaped slug provides the contact area for the die, while the while the generally increasing cross sectional area of the shaped slug, having a largest diameter substantially equal to or greater than the diagonal of the die, provides the protection for the die.

BRIEF DESCRIPTION OF THE DRAWING

FIG. 5 shows the comparative experimental data between the diode of the present invention and the conventional diode.

DETAILED DESCRIPTION OF THE PREFERRED EMBODIMENTS

Figure 1:
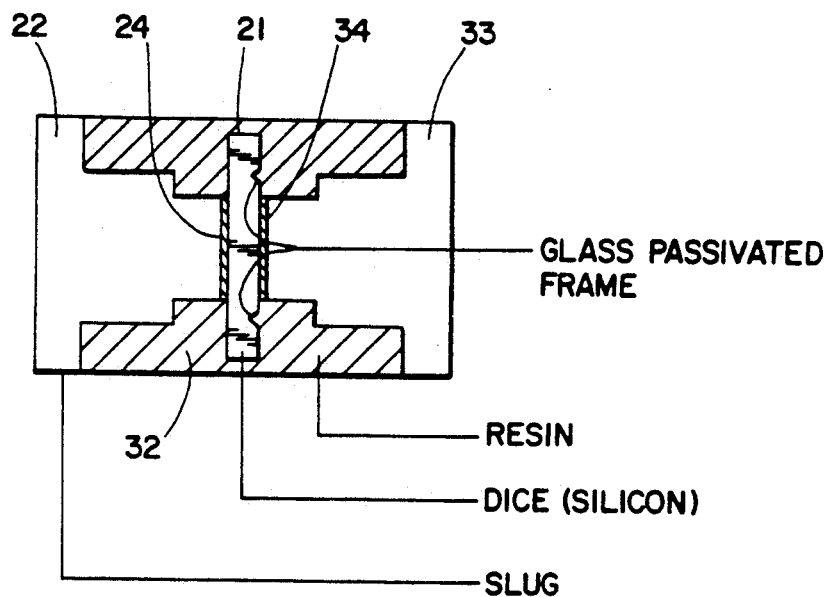
FIG. 1 is a cross sectional drawing of a conventional surface mounted diode.

FIG. 1 schematically shows the structure of a conventional diode. It can be noted that the slugs 22, 33 are smaller than the die 21 at the places near the contact areas 24, 34 between the die and the slugs. Thus, the die 21 extends beyond the slugs at least near the contact areas 24, 34 between the die and the slugs. The extensive area of the resin, as shown in the shadow area 32 of the drawing, causes a lot of stress during heat treatment, such as curing, on the extended portion of the die 21 so as to damage it. Meanwhile, during assembly and handling, the extended portion of the die is very likely to suffer collisions and thus be damaged.

Figure 2:
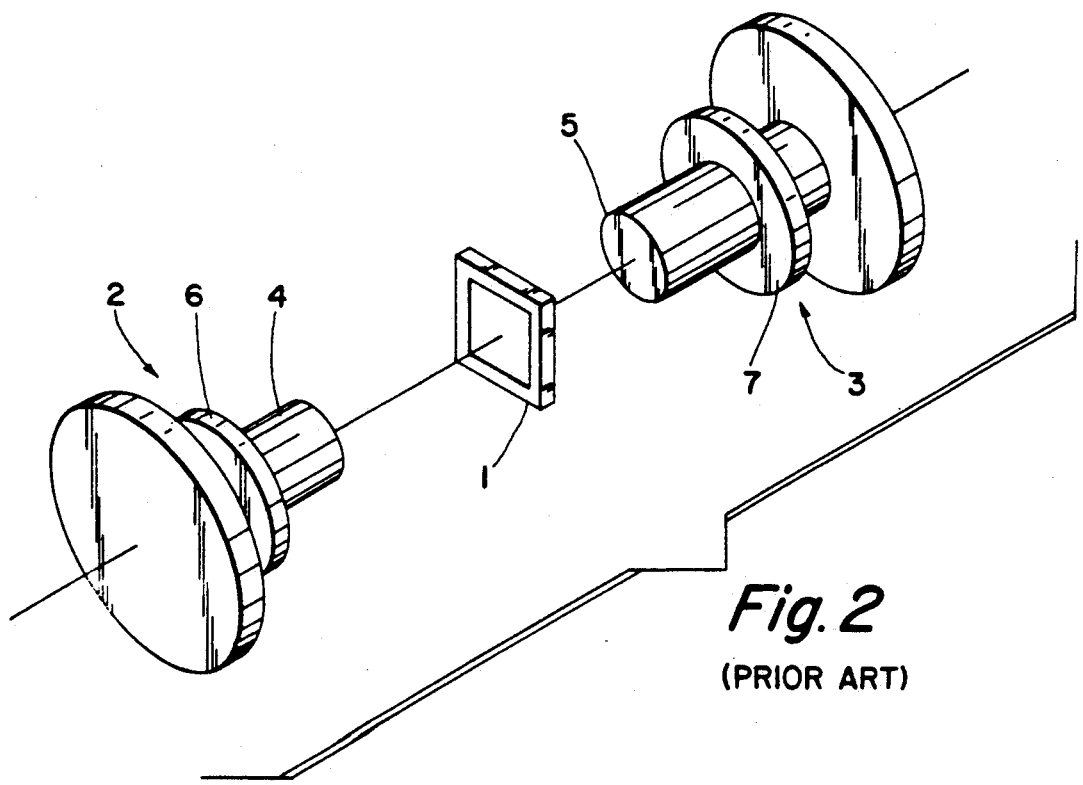
FIG. 2 shows the structure of the diode of Taiwanese Patent Application No. 762012724.
Figure 3:
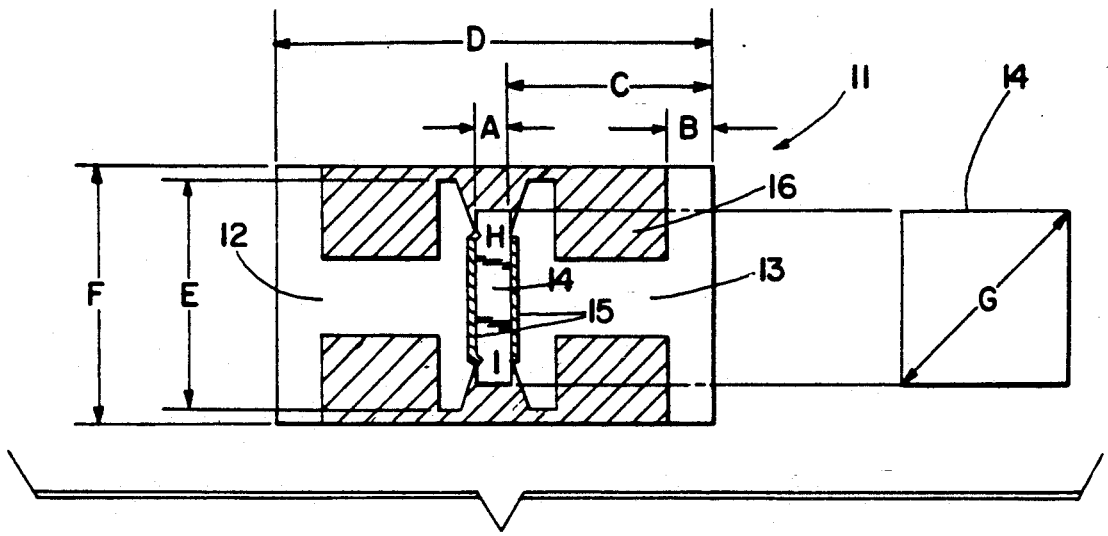
FIG. 3 shows a preferred embodiment of the surface mounted diode in accordance with the invention.

FIG. 2 is a copy of FIG. 3 of Taiwanese Patent Application No. 76201274. It shows in detail the structure of the prior art diode. The prior art diode is characterized in that the conductive terminals 2 and 3 have circular disc-like flanges 6 and 7. However, it can be clearly seen that the conductive terminals 2, 3 are smaller than the die 1 at the place 4, 5 near the contact area between the die 1 and the conductive terminals, and the die thus extends beyond the conductive terminals. The diode shown in FIG. 2 thus has the same problems as mentioned above as in the conventional diode of FIG. 1.

Referring now to FIG. 3, a surface mounted diode in accordance with the invention, generally designated by the numeral 11, comprises a pair of truncated cone shaped slugs 12 and 13. In the preferred embodiment, the two slugs are identical and in an alternate embodiment, one slug may be truncated cone shaped and the other slug may be in other shapes. The truncated cone shaped slugs 12, 13 are pointed toward each other with a die 14 disposed therebetween. Each of the slugs 12, 13 is in electrical connection with the die 14 via a solder wafer 15. The slugs 12 and 13, together with the die 14, are enclosed by an insulating casing 16, preferably made of resin. Dimension (A) is the thickness of the die, and (B) is the thickness of the end portion of the slug. Dimension (C) is the length of each slug, and (D) is the length of the surface mounted diode 11). Dimension (E) is the largest diameter of truncated cone shaped slug, and (F) is the diameter of the end portion of the slug. Dimension (G) is the diagonal of the die. The distance between (H) and (I) is the width of the contact zone of the die. The invention is characterized in that (E) is substantially equal to or greater than (G) so that the die is protected and supported by the slug.

Figure 4:
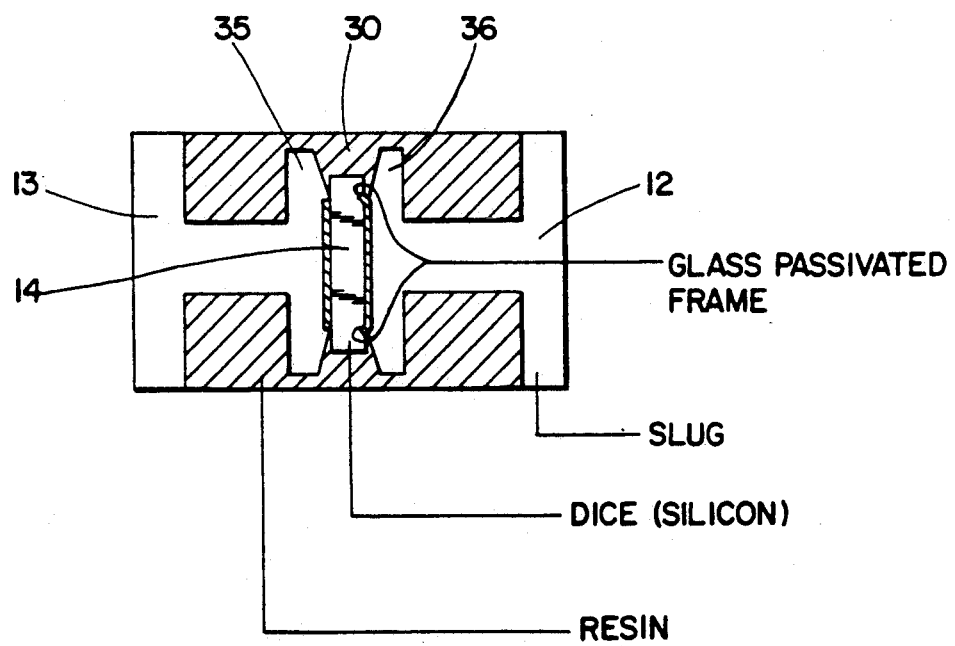
FIG. 4 is a schematic drawing of the surface mounted diode in accordance with the invention.

As shown schematically in FIG. 4, in accordance with the present invention, shows the amount of resin which potentially exerts stress on the die 14 during heat treatment is greatly reduced, compared with the larger region 32 in the conventional diode shown in FIG. 1. Thus, the portions 35 and 36 of the cone shaped slugs 12 and 13 protect the die 14 against mechanical damage due to stress during the curing of the resin. Comparative experimental data will be shown below.

Since (E) is substantially equal to or greater than (G) the die 14 will not be exposed outside the truncated cone shaped slug(s) and thus will be protected in soldering and handling the die and slug subassembly 12, 13, 14, 15 or in molding and curing the completed surface mounted diode 11. Without the protection of the slugs, the stress caused by the resin 16 in the process of molding and curing is more likely to damage the die 14. Furthermore, without the protection of the slugs collisions against the die during soldering and handling is more likely to damage the die as well. Therefore, with the arrangement of the present invention, the quality, yield and reliability of surface mounted diodes is greatly improved.

For a better understanding of the invention, the normal process for manufacturing surface mounted diodes is described in the following process steps:

(1) a slug, a solder wafer, a die, a solder wafer and a slug are put in sequential order in a tray for soldering;

(2) the above components are soldered together in an oven to form a subassembly;

(3) after soldering, the diodes in the subassembly are poured into a box and sent to the next station for molding;

(4) the diodes in subassembly form in the box are poured and shaken into a tooling tray and then molding with resin is effected;

(5) curing (e.g. at 175 degree Centigrade);

(6) deflashing;

(7) plating; and (8) testing.

The use of the present invention reduces the likelihood of damage to the die during the process steps (3), (4), and (5) above.

With respect to step (5) above, it can be seen that after molding, the diode assembly will be subjected to a temperature above the glass transition temperature TG for curing (the TG of the resin is about 150 degrees Centigrade after which the temperature will be cooled down to the room temperature). Since the linear expansion coefficient of resin ($30 \times 10^{-6}$ per degree C.) is much greater than that of the die ($3 \times 10^{-6}$ per degree C.), the resin will exert stress on the die when the temperature is cooled down (furthermore, the volume expansion coefficient is about three times of the linear expansion coefficient). According to the present invention, the die is protected by the slug, i.e. only a small region of resin (as shown in the shaded region 30 of FIG. 4) will exert stress on the die. The die is thus protected by the slugs. In contrast, in conventional diodes, the die is not protected by the slugs, i.e. a large area of the resin exerts stress on the die (as shown in the shaded area 32 of FIG. 1), and the die is more likely to be damaged. Furthermore, in some kinds of diodes, the PN junction of the die is passivated by glass only on one side of the die (for example, the groove encircled by (H) and (I) in FIG. 3) to protect the die from overflowing during soldering. In such an asymmetrical structure, the stress caused by the resin may result in cracking of the glass portion which can result in a short circuit or a high leakage current. With the protection of the invented slug, short circuited diodes or diodes with high leakage current may be avoided as well.

With respect to steps (3) and (4) above, it is noted that the die in a conventional diode as shown in FIG. 1, including that of Taiwanese patent application as shown in FIG. 2, is exposed and unprotected by the slug. In steps (3) and (4) for manufacturing a diode as mentioned above, as the subassemblies consisting of a die soldered to two slugs are transferred and handled, there are collisions against the die. The die, if not protected by the slug as provided by the invention, will be damaged easily. An alternative possible approach to reduce collision is to change the steps (3) and (4) as follows:

Step (3') to put the diodes in subassembly after soldering on a piece of sponge or other cushioning material, and send them to the molding station; and Step (4'): to manually pick up the diodes in subassembly one by one by an appropriate tool, such such as a tweezer and put them in the tooling tray.

However, in the alternate approach, more labor is required to perform steps (3') and (4') as compared to steps (3) and (4). It will have a very low yield and thus is impractical. The present invention permits the use of the conventional steps (3) and (4), requiring less labor, and producing a high yield of good quality products.

Table 1 in FIG. 5 further shows the advantages achieved by the invention. As compared with the conventional diode, the success rate of using the invention is at least 95% and the failure rate in soldering is 0%. Meanwhile, by the use of the invention, no additional labor for special handling is required as in steps (3') and (4'), and high yield production is obtained.

I claim:

1. A surface mounted diode comprising a pair of slugs 12, 13 pointing toward each other with a die 14 disposed therebetween, characterized in that at least one of the slugs is a truncated shape having a substantially flat contact area with a diameter smaller than the diameter of the die, and having an increased cross sectional area at each increased distance beginning at the surface of the die for a given distance from the surface of the die, in which the largest diameter of the truncated shaped slug within said given distance from the surface of the die is substantially equal to or greater than the diagonal of the die.

2. A surface mounted diode according to claim 1, wherein the truncated shaped slug is a truncated cone shape.

3. A surface mounted diode according to claim 1, wherein the truncated shaped slug is a truncated pyramid shape.

4. A surface mounted diode according to claim 1, wherein the truncated shaped slug is a truncated sphere shape.

5. A surface mounted diode according to claim 1, wherein the truncated shaped slug is a truncated ellipsoid shape.

6. A surface mounted diode according to claim 1, wherein the two slugs are identical truncated shaped slugs.

* * * * *